United States Patent
Tokunaga et al.

(10) Patent No.: US 6,329,818 B1
(45) Date of Patent: Dec. 11, 2001

(54) MAGNETIC FIELD SENSOR HAVING GIANT MAGNETORESISTIVE EFFECT ELEMENTS, MANUFACTURING METHOD AND APPARATUS THEREFOR

(75) Inventors: Ichirou Tokunaga; Seiji Kikuchi, both of Miyagi-ken; Yoshito Sasaki; Takashi Hatanai, both of Niigata-ken, all of (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/353,925

(22) Filed: Jul. 14, 1999

(30) Foreign Application Priority Data

Jul. 17, 1998 (JP) .................................... 10-204066

(51) Int. Cl.$^7$ ............................. G01R 33/09; H01L 43/08
(52) U.S. Cl. ......................... 324/252; 338/32 R; 428/900
(58) Field of Search ............................ 324/207.21, 252, 324/117 R; 338/32 R; 427/127; 428/692, 900; 360/314, 316, 324, 324.1

(56) References Cited

U.S. PATENT DOCUMENTS

| | | |
|---|---|---|
| 5,247,278 * | 9/1993 | Pant et al. ..................... 338/32 R |
| 5,408,377 | 4/1995 | Gurney et al. . |
| 5,561,368 | 10/1996 | Dovek et al. . |
| 5,686,837 | 11/1997 | Coehoorn et al. . |
| 5,945,825 * | 8/1999 | Clemens ........................... 324/252 |
| 6,020,738 * | 2/2000 | Van Den Berg et al. ........... 324/252 |
| 6,075,361 * | 6/2000 | Coehoorn et al. ................. 324/252 |

FOREIGN PATENT DOCUMENTS 195 20 206
A1 12/1996 (DE).

* cited by examiner

Primary Examiner—Gerard R. Strecker
(74) Attorney, Agent, or Firm—Brinks Hofer Gilson & Lione

(57) ABSTRACT

The present invention is characterized in that a first giant magnetoresistive effect element and a second giant magnetoresistive effect element are provided along a first straight line with the magnetization of the pinned magnetic layer c oriented in a fixed direction, and that a third giant magnetoresistive effect element and a fourth giant magnetoresistive effect element are provided along a second straight line, which is parallel to the first straight line, with the magnetization of the pinned magnetic layer oriented 180° opposite to the directions of magnetization of the pinned magnetic layers in the first and second giant magnetoresistive effect elements.

16 Claims, 10 Drawing Sheets

MAGNETIC FIELD SENSOR HAVING GIANT MAGNETORESISTIVE EFFECT ELEMENTS, MANUFACTURING METHOD AND APPARATUS THEREFOR

BACKGROUND OF THE INVENTION

1. Field of the Invention

The present invention relates to a magnetic field sensor having giant magnetoresistive effect elements which cause significant changes in the resistance in response to changes in an external magnetic field, a method for manufacturing the same and an apparatus therefor.

2. Prior Art

Conventionally, as a magnetic field sensor using giant magnetoresistive effect elements, there has been known a magnetic field sensor constructed by bridge-connecting four giant magnetoresistive effect elements as disclosed in Japanese Published Unexamined Patent Application No. Hei 8-226960.

The magnetic field sensor A disclosed in this publication is, as shown in FIG. 12, constructed such that there are provided giant magnetoresistive effect elements 1, 2, 3 and 4 arranged to be apart from one another; the giant magnetoresistive effect elements 1 and 2 are connected through a conductor 5; the giant magnetoresistive effect elements 1 and 3 are connected through a conductor 6; the giant magnetoresistive effect elements 3 and 4 are connected through a conductor 7; the giant magnetoresistive effect elements 2 and 4 are connected through a conductor 8; an input terminal 10 is provided by connecting it to the conductor 6; an input terminal 11 is provided by connecting it to the conductor 8; an output terminal 12 is provided by connecting it to the conductor 5; and an output terminal 13 is provided by connecting it to the conductor 7.

The giant magnetoresistive effect element 1, 2, 3 or 4 has a sandwich structure in which ferromagnetic layers 16 and 17 are provided above and below a non-magnetic layer 15 respectively, and is constructed such that an exchange bias layer 18 such as an antiferromagnetic layer is provided on the one ferromagnetic layer (pinned magnetic layer) 16, and that exchange coupling is achieved by means of this exchange bias layer 18 to pin the direction of magnetization of the ferromagnetic layer 16 in one direction. Also, the direction of magnetization of the other ferromagnetic layer (free magnetic layer) 17 is made freely rotatable in accordance with the direction of the external magnetic field, for example, freely rotatable along the horizontal plane including the ferromagnetic layer 17.

In a magnetic field sensor A having the structure shown in FIG. 12, the direction of magnetization of the pinned magnetic layer 16 in the giant magnetoresistive effect element 1 is made to be frontward as indicated by the arrow 20 in FIG. 13, the direction of magnetization of the pinned magnetic layer 16 in the giant magnetoresistive effect element 2 is made to be backward as indicated by the arrow 21, the direction of magnetization of the pinned magnetic layer 16 in the giant magnetoresistive effect element 3 is made to be backward as indicated by the arrow 23, and the direction of magnetization of the pinned magnetic layer 16 in the giant magnetoresistive effect element 4 is made to be frontward as indicated by the arrow 23. The directions of magnetization of the free magnetic layers 17 in the giant magnetoresistive effect elements 1, 2, 3 and 4 are made to be rightward as indicated by the arrow 24 in FIG. 12 respectively in the absence of an applied external magnetic field.

When an external magnetic field H acts on the magnetic field sensor A shown in FIG. 12, the direction of magnetization 24 of the free magnetic layer 17 rotates by a predetermined angle d as shown in FIG. 13 in, for example, the first and fourth giant magnetoresistive effect elements 1 and 4 so as to meet the external magnetic field H. Therefore, the angular relation with the direction of magnetization 20 of the pinned magnetic layer 16 changes, resulting in a change in resistance. Also, since the direction of magnetization of the pinned magnetic layer 16 in the first and fourth giant magnetoresistive effect elements 1 and 4, and the direction of magnetization of the pinned magnetic layer 16 in the second and third giant magnetoresistive effect elements 2 and 3 are 180° opposite to each other, output having different phases in a resistance change state can be obtained.

In a bridge-connected type magnetic field sensor A shown in FIG. 12, these directions of magnetization are defined as indicated by each arrow. This is because, since when the direction of magnetization of the free magnetic layer 17 changes in response to the external magnetic field H, it is necessary to obtain differential output from the giant magnetoresistive effect elements 1, 2, 3 and 4, the direction of magnetization must be pinned in the antiparallel direction, which is 180° different in direction, between adjacent ones which are adjacent to one another in the giant magnetoresistive effect elements 1, 2, 3 and 4 located left, right, up and down in FIG. 12.

In order to implement the structure shown in FIG. 12, it is necessary to form the giant magnetoresistive effect elements 1, 2, 3 and 4 on a substrate so as to be adjacent to one another, and to fix the directions of magnetization of the pinned magnetic layers 16 in those giant magnetoresistive effect elements adjacent in directions which are 180° different respectively.

In order to control the direction of magnetization of the pinned magnetic layer 16 of this sort, it is necessary to adjust lattice magnetization of the exchange bias layer 18. To this end, it is necessary to apply a magnetic field having a predetermined direction to the exchange bias layer 18 in advance in a state in which it has been heated at a temperature, or higher, called "blocking temperature" at which the ferromagnetism disappears, and to perform heat treatment in which cooling is performed while this magnetic field is being applied.

In the structure shown in FIG. 12, however, since the direction of magnetization of the exchange bias layer 18 must be changed by 180° for each of the giant magnetoresistive effect elements 1, 2, 3 and 4, it becomes necessary to control the direction of the magnetic field for each of the giant magnetoresistive effect elements which have been formed in an adjacent state on the substrate. By means of a method of merely applying a magnetic field by a magnetic field generating apparatus such as an electromagnet from the outside, it is possible to apply the magnetic field only in one direction, and therefore, there has been a problem that it is difficult to manufacture the structure shown in FIG. 12.

For this reason, according to the technique disclosed in the Japanese Published Unexamined Patent Application No. Hei 8-226960, it is described that conductor layers are stacked along the giant magnetoresistive effect elements 1, 2, 3 and 4 formed in an adjacent state on the substrate respectively, and the above-described heat treatment is performed while magnetic fields having different directions are caused to be generated individually from each conductor layer by flowing currents having different directions through each of these conductor layers, whereby the structure shown in FIG. 12 can be implemented. However, Although it is desired to generate a great magnetic field by applying a large current to the conductor film in order to control the lattice magnetization of the exchange bias layer 18, it is difficult to flow a large current through the thin film-shaped conductor film stacked together with the giant magnetoresistive effect elements on the substrate, and in the magnetic field which can be generated from the conductor film, there is a problem that cannot be effectively dealt with by applying a strong magnetic field. Further, since magnetic fields having different directions act on the giant magnetoresistive effect elements 1, 2, 3 and 4 provided in an adjacent state on the substrate from a plurality of conductor films, there has been a problem that it is very difficult to individually cause the strong magnetic field to act on the exchange bias layer 18 in the individual giant magnetoresistive effect elements.

SUMMARY OF THE INVENTION

The present invention has been achieved in the light of the above-described state of affairs, and is aimed to provide a technique of implementing a bridge-connected type magnetic field sensor having giant magnetoresistive effect elements capable of implementing the bridge-connection even if the directions of magnetization of one set of pinned magnetic layers adjacent are aligned by adoption of a peculiar structure.

It is an object of the present invention to provide a magnetic field sensor capable of reliably controlling the magnetization of exchange bias layers in four giant magnetoresistive effect elements in desirable directions as a bridge-connected type individually, and easily performing the control, its manufacturing method and apparatus.

In order to solve the above-described problem, there is, according to the present invention, provided a plurality of giant magnetoresistive effect elements, each of the giant magnetoresistive effect elements comprising at least, an exchange bias layer; a pinned magnetic layer whose direction of magnetization has been fixed in one direction by means of the exchange bias layer; a non-magnetic layer; and a free magnetic layer whose direction of magnetization has been made freely rotatable by means of an external magnetic field. The present invention is further characterized in that a first giant magnetoresistive effect element and a second giant magnetoresistive effect element are provided along a first straight line, that the magnetization of each pinned magnetic layer is oriented in a fixed direction, that a third giant magnetoresistive effect element and a fourth giant magnetoresistive effect element are provided along a second straight line parallel to the first straight line, and that the magnetization of each pinned magnetic layer is oriented in a direction 180° opposite to the directions of magnetization of the pinned magnetic layers in the first and second giant magnetoresistive effect elements.

In order to solve the above-described problem, the present invention is characterized in that first, second, third and fourth giant magnetoresistive effect elements are provided along first, second, third and fourth straight lines which are adjacent substantially in parallel respectively, that the magnetization of respective pinned magnetic layers in the first and second giant magnetoresistive effect elements is oriented in a fixed direction, and that the magnetization of respective pinned magnetic layers in the third and fourth giant magnetoresistive effect elements is oriented in a direction 180° opposite to the directions of magnetization of respective pinned magnetic layers in the first and second giant magnetoresistive effect elements.

In the above-described structure, there can be adopted such structure according to the present invention that giant magnetoresistive effect elements having pinned magnetic layers magnetized in different directions are connected in series to constitute two sets of paired connections, that one end of a first paired connection of giant magnetoresistive effect elements is connected to one end of a second paired connection of giant magnetoresistive effect elements to constitute a first connection portion, that the other end of the second paired connection of giant magnetoresistive effect elements is connected to the other end of the first paired connection of giant magnetoresistive effect elements to constitute a second connection portion, that each of the connection portions is constituted at a middle point between the giant magnetoresistive effect elements connected in series, and that an input-side terminal portion is formed at a pair of the connection portions while an output-side terminal portion is formed at a pair of the other connection portions.

Further, according to the present invention, the structure may be arranged such that one side of the first giant magnetoresistive effect element is connected to one side of the fourth giant magnetoresistive effect element, one side of the second giant magnetoresistive effect element is connected to one side of the third giant magnetoresistive effect element, the other side of the first giant magnetoresistive effect element is connected to the other side of the third giant magnetoresistive effect element, and the other side of the second giant magnetoresistive effect element is connected to the other side of the fourth giant magnetoresistive effect element, while an input-side terminal portion is connected to one of a portion connected between one side of each of the giant magnetoresistive effect elements and one side thereof, and a portion connected between the other side and the other side, and an output-side terminal portion is connected to the other portion.

A manufacturing method according to the present invention is characterized in that for manufacturing a magnetic field sensor having four giant magnetoresistive effect elements, each of the giant magnetoresistive effect elements comprise: at least, an exchange bias layer; a pinned magnetic layer whose direction of magnetization has been fixed in one direction by means of this exchange bias layer; a non-magnetic layer; and a free magnetic layer whose direction of magnetization has been made freely rotatable by means of an external magnetic field. The first giant magnetoresistive effect element and a second giant magnetoresistive effect element are arranged along a first straight line, a first electric conductor is arranged along the first straight line, a third giant magnetoresistive effect element and a fourth giant magnetoresistive effect element are arranged along a second straight line, and a second electric conductor is arranged along said second straight line. Currents having different directions by 180° are flowed through the first electric conductor and the second electric conductor to generate magnetic fields from each electric conductor, the exchange bias layer in each giant magnetoresistive effect element is magnetized by means of the magnetic fields generated from each electric conductor to thereby fix the magnetization of each of the pinned magnetic layers, the pinned magnetic layers in the first and second giant magnetoresistive effect elements are oriented in a fixed direction, and the pinned magnetic layers in the third and fourth giant magnetoresistive effect elements are oriented 180° opposite to the directions of the pinned magnetic layers in the first and second giant magnetoresistive effect elements.

A manufacturing method according to the present invention is characterized in that a first giant magnetoresistive effect element, a second giant magnetoresistive effect element, a third giant magnetoresistive effect element, and a fourth giant magnetoresistive effect element are arranged along first, second, third and fourth straight lines, which are adjacent substantially in parallel, that a first electric conductor is arranged along the first and second giant magnetoresistive effect elements, a second electric conductor is arranged along the third and fourth giant magnetoresistive effect elements, that currents having different directions by 180° are flowed through the first and second electric conductors to generate magnetic fields from each electric conductor, and the exchange bias layer in each giant magnetoresistive effect element is magnetized by means of the magnetic fields generated from each electric conductor to thereby fix the magnetization of each of the pinned magnetic layers, and that the pinned magnetic layers in the first and second giant magnetoresistive effect elements are oriented in a fixed direction, and the pinned magnetic layers in the third and fourth giant magnetoresistive effect elements are oriented in a direction 180° opposite to the directions of the pinned magnetic layers in the first and second giant magnetoresistive effect elements.

In the manufacturing method previously described, it is preferable to connect the first and second electric conductors in series, and to connect them to the same power source for applying a current.

A manufacturing apparatus according to the present invention is an apparatus for manufacturing a magnetic field sensor having four giant magnetoresistive effect elements, each of the giant magnetoresistive effect elements comprising: at least, an exchange bias layer; a pinned magnetic layer whose direction of magnetization has been fixed in one direction by means of this exchange bias layer; a nonmagnetic layer; and a free magnetic layer whose direction of magnetization has been made freely rotatable by means of an external magnetic field. Wherein a first giant magnetoresistive effect element and a second giant magnetoresistive effect element are arranged along a first straight line, a first electric conductor is arranged along said first straight line, a third giant magnetoresistive effect element and a fourth giant magnetoresistive effect element are arranged along a second straight line, and a second electric conductor is arranged along the second straight line. There is provided a power source for flowing currents having different directions by 180° through the first electric conductor and the second electric conductor. The pinned magnetic layers in the first and second giant magnetoresistive effect elements are oriented in a fixed direction, and the pinned magnetic layers in the third and fourth giant magnetoresistive effect elements are oriented 180° opposite to the directions of the pinned magnetic layers in the first and second giant magnetoresistive effect elements.

A manufacturing apparatus according to the present invention is characterized in that a first giant magnetoresistive effect element, a second giant magnetoresistive effect element, a third giant magnetoresistive effect element, and a fourth giant magnetoresistive effect element are arranged along first, second, third and fourth straight lines, which are adjacent substantially in parallel, a first electric conductor is arranged along the first and second giant magnetoresistive effect elements, a second electric conductor is arranged along the third and fourth giant magnetoresistive effect elements, there is provided a power source for flowing currents having different directions by 180° through the first electric conductor and the second electric conductor, the pinned magnetic layers in the first and second giant magnetoresistive effect elements are oriented in a fixed direction, and the pinned magnetic layers in the third and fourth giant magnetoresistive effect elements are oriented 180° opposite to the directions of the pinned magnetic layers in the first and second giant magnetoresistive effect elements.

In an apparatus having the above-described structure, it is preferable to connect the first and second electric conductors in series for connecting them to the same power source. Further, in the apparatus having the structure, the first electric conductor and the second electric conductor are preferably connected in a loop shape in series.

DESCRIPTION OF THE PREFERRED EMBODIMENTS

Hereinafter, with reference to the drawings, a description will be made of a first embodiment of a magnetic field sensor according to the present invention.

Figure 1:
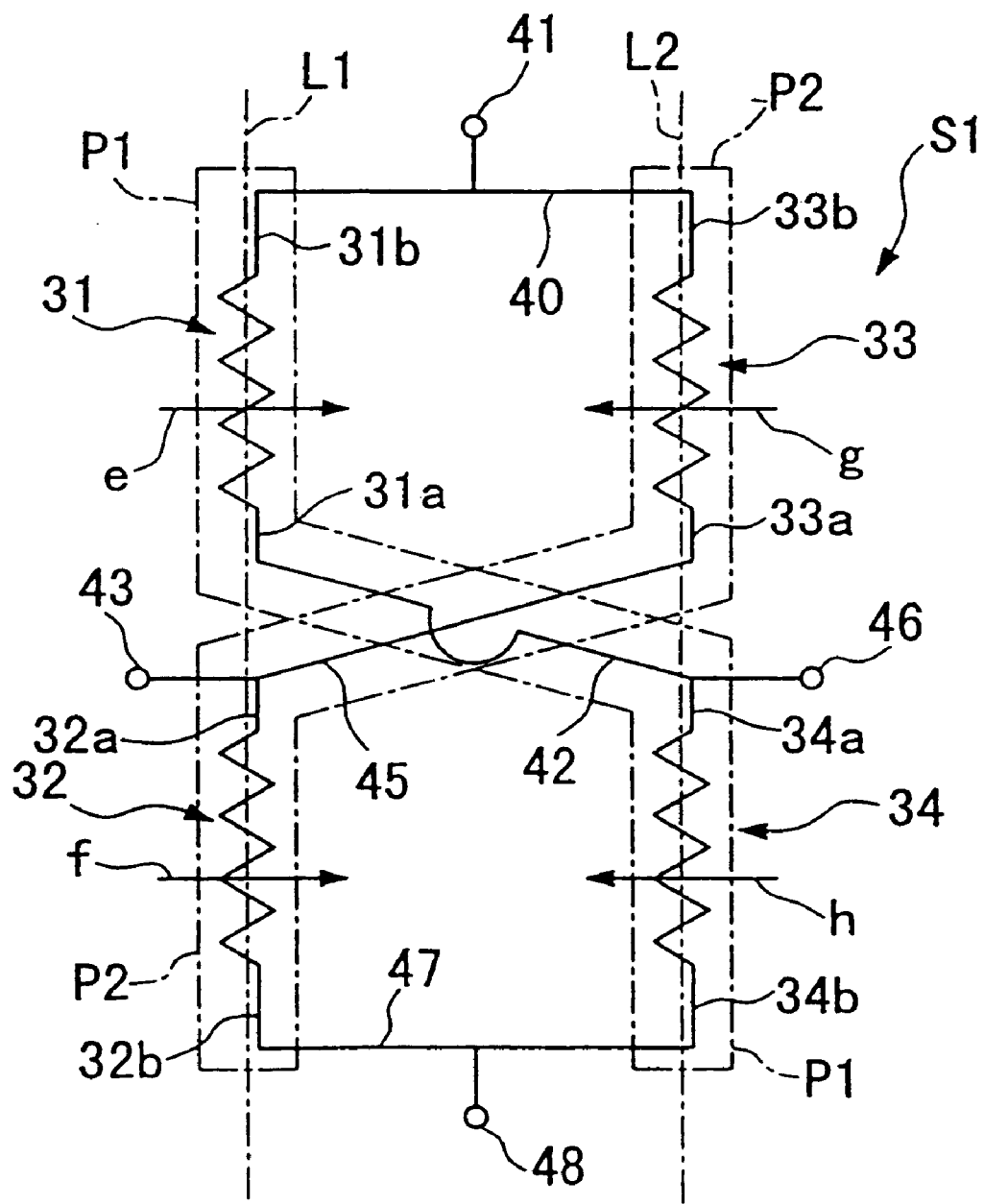
FIG. 1 is a circuit diagram showing a first embodiment of a magnetic field sensor according to the present invention.
Figure 2:
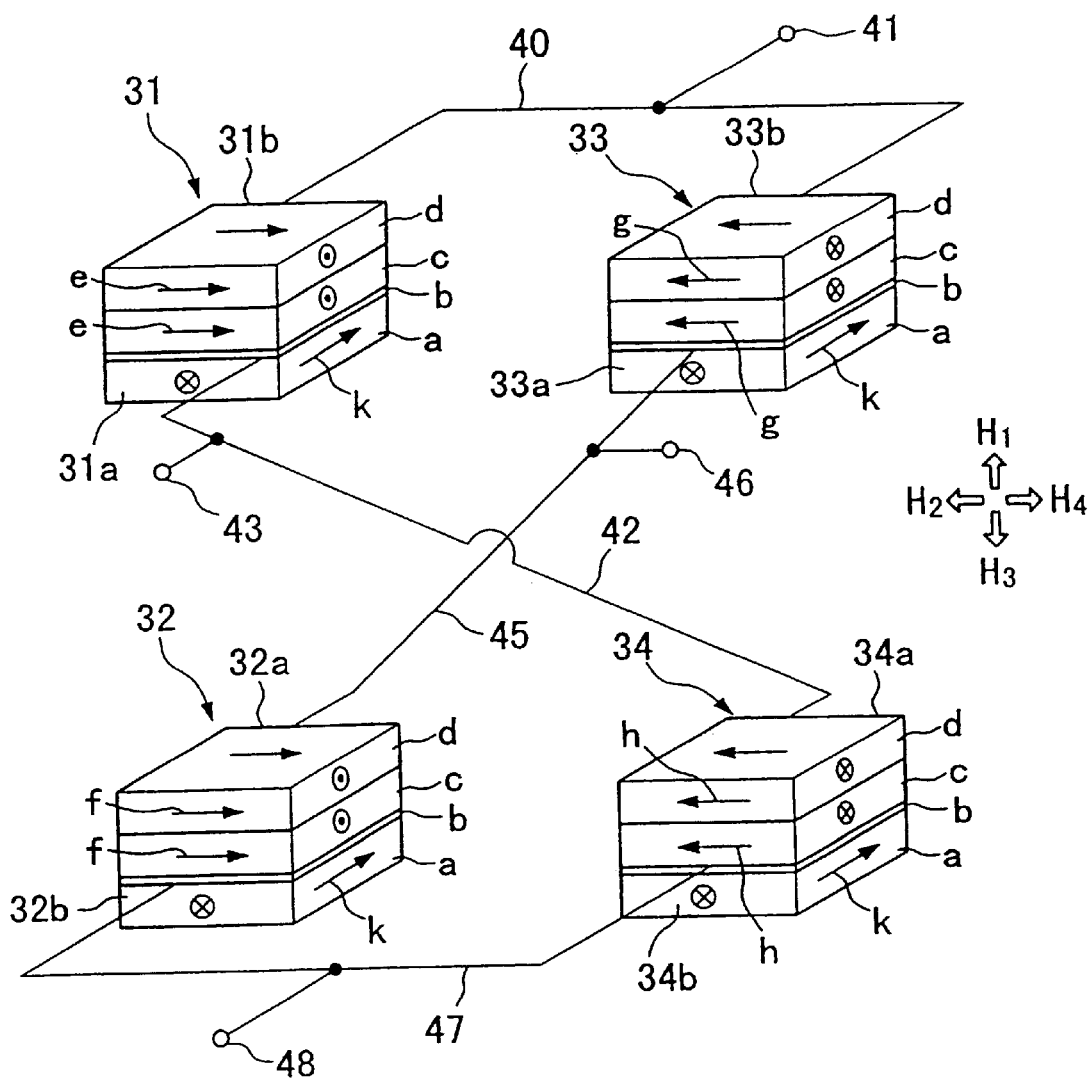
FIG. 2 is a schematic structural view showing stacked structure for giant magnetoresistive effect elements provided for a magnetic field sensor of the first embodiment.
Figure 3:
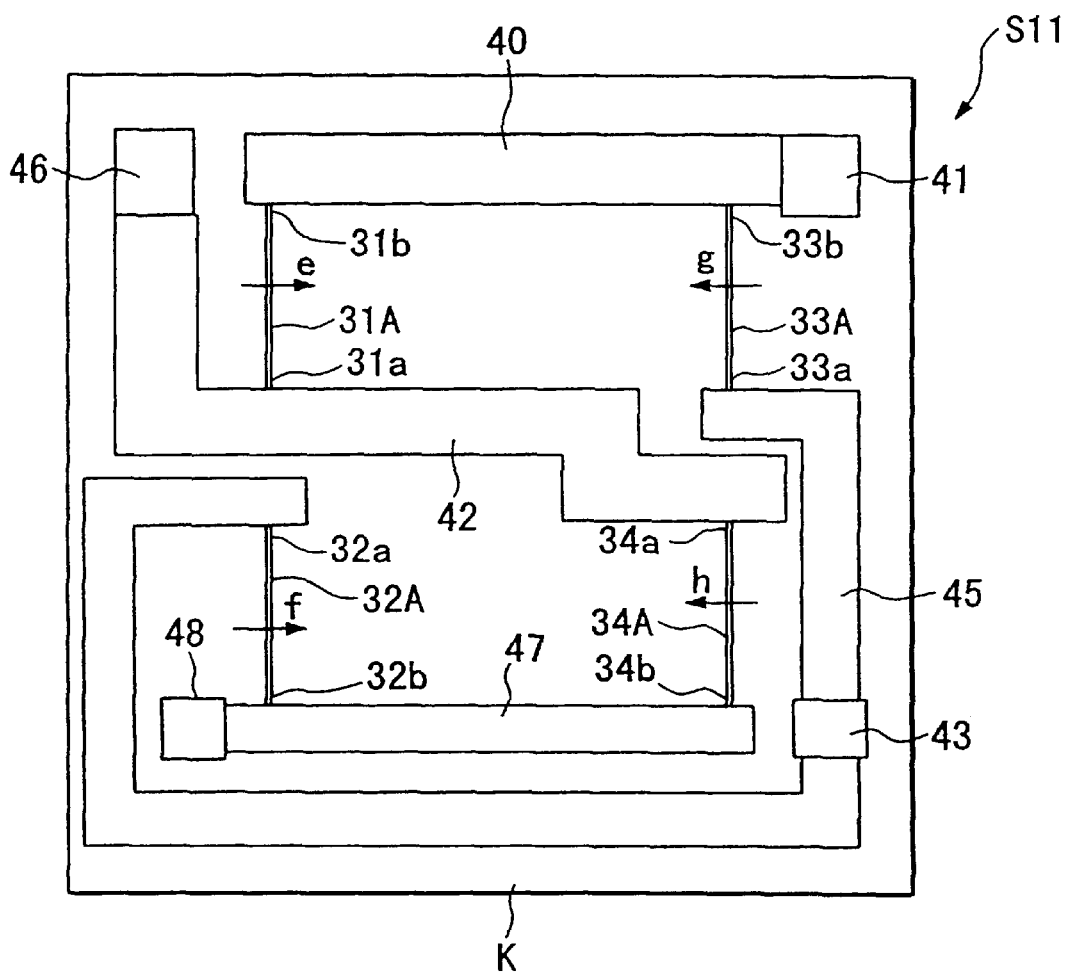
FIG. 3 is a plan view showing an example of a magnetic field sensor obtained by actually manufacturing the first embodiment on a substrate.

FIG. 1 is a basic circuit diagram showing a magnetic field sensor S1 according to a first embodiment of the present invention; FIG. 2 is a schematic structural view showing the basic conception; and FIG. 3 is a plan view showing an example of structure in which the magnetic field sensor is formed on an actual substrate.

A magnetic field sensor S1 of the first embodiment comprises: a first giant magnetoresistive effect element 31 arranged in the left upper portion in FIG. 1; a second giant magnetoresistive effect element 32 arranged in the left lower portion in FIG. 1; a third giant magnetoresistive effect element 33 arranged in the right upper portion in FIG. 1; and a fourth giant magnetoresistive effect element 34 arranged in the right lower portion in FIG. 1. These giant magnetoresistive effect elements 31, 32, 33 and 34 are all composed of layered products of thin films as described later, and are of a linear, long and narrow shape. The first and second giant magnetoresistive effect elements 31 and 32 are arranged along a first straight line L1 shown in FIG. 1, and the third and fourth giant magnetoresistive effect elements 33 and 34 are arranged along a second straight line L2 provided to be apart from the first straight line L1 and in parallel thereto.

Further, the first and third giant magnetoresistive effect elements 31 and 33 are arranged at positions where they are laterally opposed to each other, and the second and fourth giant magnetoresistive effect elements 32 and 34 are arranged at positions where they are laterally opposed to each other.

In this respect, in this embodiment, the first and second giant magnetoresistive effect elements 31 and 32 are arranged on a first straight line, and the third and fourth giant magnetoresistive effect elements 33 and 34 are arranged on a second straight line. The magnetoresistive effect elements 31, 32, 33 and 34, may each be slightly shifted in the lateral direction while remaining parallel to each other, and may be slightly inclined with respect to each other.

FIG. 2 clarifies the basic stacked structure for giant magnetoresistive effect elements 31, 32, 33 and 34 according to the present embodiment, and the directions of magnetization of each layer of the elements. The giant magnetoresistive effect elements 31, 32, 33 and 34 are all of the same structure, and are basically constructed by stacking a ferromagnetic layer (free magnetic layer) a, a non-magnetic layer b, a ferromagnetic layer (pinned magnetic layer) c and an exchange bias layer (antiferromagnetic layer) d as shown in FIG. 2.

In the basic stacked structure shown in FIG. 2, the pinned magnetic layer c, which is adjacent to the exchange bias layer d, has the direction of magnetization pinned by means of the exchange bias layer d. Concretely, in the first giant magnetoresistive effect element 31, the directions of magnetization of the exchange bias layer d and the pinned magnetic layer c are set to be rightward as indicated by the arrow e, while in the second giant magnetoresistive effect element 32, the directions of magnetization of the exchange bias layer d and the pinned magnetic layer c are set to be rightward as indicated by the arrow f.

In the third giant magnetoresistive effect element 33, the directions of magnetization of the exchange bias layer d and the pinned magnetic layer c are set to be leftward as indicated by the arrow g, while in the fourth giant magnetoresistive effect element 34, the directions of magnetization of the exchange bias layer d and the pinned magnetic layer c are set to be leftward as indicated by the arrow h. Therefore, the directions of magnetization of the pinned magnetic layers c in the first and second giant magnetoresistive effect elements 31 and 32 are in parallel to each other, while the directions of magnetization of the pinned magnetic layers c in the third and fourth giant magnetoresistive effect elements 33 and 34 are in parallel to each other. Also, the directions of magnetization of the pinned magnetic layers c in the first and second giant magnetoresistive effect elements 31 and 32 are set to be 180° opposite to those of the pinned magnetic layers c in the third and fourth giant magnetoresistive effect elements 33 and 34.

The magnetization of the free magnetic layers a in the first, second, third and fourth giant magnetoresistive effect elements 31, 32, 33 and 34 is oriented in unspecified directions in the absence of an applied external magnetic field.

One side 31a of the first giant magnetoresistive effect element 31 and one side 34a of the fourth giant magnetoresistive effect element 34 are connected through an electric conductor 42, this electric conductor 42 is made into a connection portion, and a terminal portion 43 is connected to the connection portion consisting of the electric conductor 42. One side 32a of the second giant magnetoresistive effect element 32 and one side 33a of the third giant magnetoresistive effect element 33 are connected through an electric conductor 45, this electric conductor 45 is made into a connection portion, and a terminal portion 46 is connected to the electric conductor 45. Further, the other side 31b of the first giant magnetoresistive effect element 31 and the other side 33b of the third giant magnetoresistive effect element 33 are connected through an electric conductor 40, this electric conductor 40 is made into a connection portion, and a terminal portion 41 is connected to the electric conductor 40. The other side 32b of the second giant magnetoresistive effect element 32 and the other side 34b of the fourth giant magnetoresistive effect element 34 are connected through an electric conductor 47, this electric conductor 47 is made into a connection portion, and a terminal portion 48 is connected to the electric conductor 47.

Therefore, the first giant magnetoresistive effect element 31 and the fourth giant magnetoresistive effect element 34 are connected in series to constitute a first paired connection P1, and the second giant magnetoresistive effect element 32 and the third giant magnetoresistive effect element 33 are connected in series to constitute a second paired connection P2.

FIG. 3 shows an example of magnetic field sensor S11 comprising giant magnetoresistive effect elements 31A, 32A, 33A and 34A having the same structure as the giant magnetoresistive effect elements 31, 32, 33 and 34 having the basic structure shown in FIGS. 1 and 2; electric conductors 40, 42, 45 and 47; and terminal portions 41, 43, 46 and 48 actually stacked on a substrate K.

In this example of the magnetic field sensor S11, the substrate Si is made of non-magnetic insulating material such as a K substrate, and a substrate coated, on the upper surface thereof, with ground film including $Al_2O_3$ in order to flatten or enhance the insulation characteristics is preferably used.

On this substrate K, there are formed linear giant magnetoresistive effect elements 31A, 32A, 33A and 34A having basically the stacked structure shown in FIG. 2, arranged along the straight lines L1 and L2 as shown in FIG. 1. Electric conductors 40, 42, 45 and 47 made of conductive metallic material such as Cr and Cu, through which the giant magnetoresistive effect elements 31A, 32A, 33A and 34A are connected, and terminal portions 41, 43, 46 and 48 are formed such that they are located on the corner portion side of the substrate K. The detailed cross-sectional structure for the giant magnetoresistive effect element 31 having this form is typically represented by FIG. 4. The giant magnetoresistive effect element having this form is formed into an equal-leg trapezoid shape in cross section by stacking an exchange bias layer (antiferromagnetic layer) d, a pinned magnetic layer c, a subferromagnetic layer m, a non-magnetic layer b, a subferromagnetic layer n, and a free magnetic layer a in this order on the substrate K, and any of the electric conductors are connected to the side of these layered products so as to come into contact with each layer.

Figure 4:
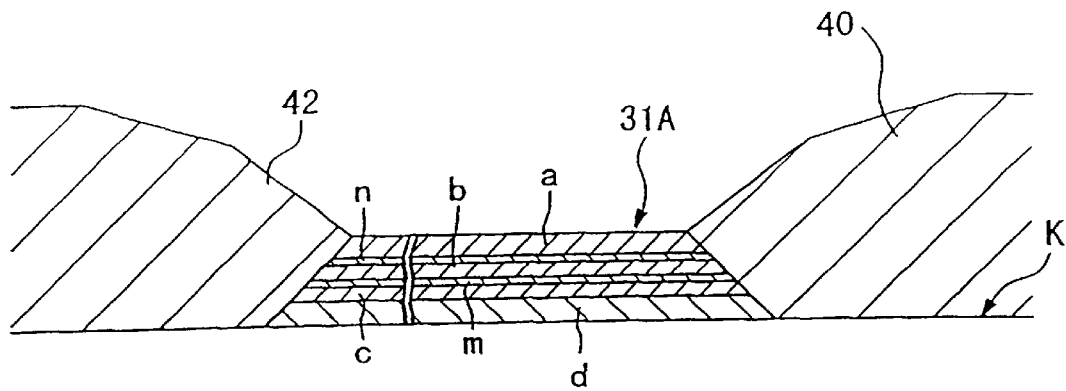
FIG. 4 is across-sectional view showing concrete stacked structure of giant magnetoresistive effect elements applied to the magnetic field sensor shown in FIG. 3 and a connected portion of an electric conductor.

In this respect, in the cross-sectional structure shown in FIG. 4, the structure may be arranged by appropriately providing the joined portion between the end portions of each layered product and the electric conductors with a bias layer for breaking up the free magnetic layer a into several single domain structures.

In the structure of FIG. 4, the subferromagnetic layers m and n are layers consisting of ferromagnetic material such as Co and Co alloy which are provided to more effectively exhibit the magnetic resistance effect, and these layers may be omitted. Also, the order of stacking of the exchange bias layer d, the pinned magnetic layer c, the subferromagnetic layer m, the non-magnetic layer b, the subferromagnetic layer n, and the free magnetic layer a may be reversed.

In this respect, as more concrete stacked structure for giant magnetoresistive effect elements, there can be exemplified α-$Fe_2O_3$ layer (exchange bias layer)/NiFe layer (pinned magnetic layer)/Co layer (subferromagnetic layer)/Cu layer (non-magnetic layer)/Co layer (subferromagnetic layer)/NiFe layer (free magnetic layer). Also, as a current shunt layer, an $Al_2O_3$ layer may be provided below the α-$Fe_2O_3$ layer as required. Further, in addition to the above structure, there can also be exemplified giant magnetoresistive effect elements having a stacked structure of α-$Fe_2O_3$ layer/Co layer/Cu layer/Co layer/NiFe layer/Co layer/Cu layer/Co layer/α-$Fe_2O_3$ layer. Further, for the exchange bias layer, any of the known ones may be used so long as the direction of magnetization of a pinned magnetic layer adjacent thereto can be pinned, and therefore, in addition to the α-$Fe_2O_3$ layer, there may be used a FeMn layer, a NiMn layer, a NiO layer, an IrMn layer, a CrPtMn layer, a PdPtMn layer, a MnRhRu layer, a PtMn layer or the like.

When external magnetic fields $H_1$, $H_2$, $H_3$ and $H_4$ operate on the magnetic field sensor S1 shown in FIGS. 1 and 2, the direction of magnetization of each free magnetic layer a in the giant magnetoresistive effect elements 31, 32, 33 and 34 rotates so as to meet these magnetic fields $H_1$, $H_2$, $H_3$ and $H_4$, and as a result, a change in electric resistance is created in accordance with the rotating angle.

In order to measure this change in electric resistance, the terminal portion 41 and the terminal portion 48 are regarded as an input portion respectively to flow a predetermined current, and the terminal portions 43 and 46 are regarded as an output portion respectively to measure the resistance.

Figure 5:
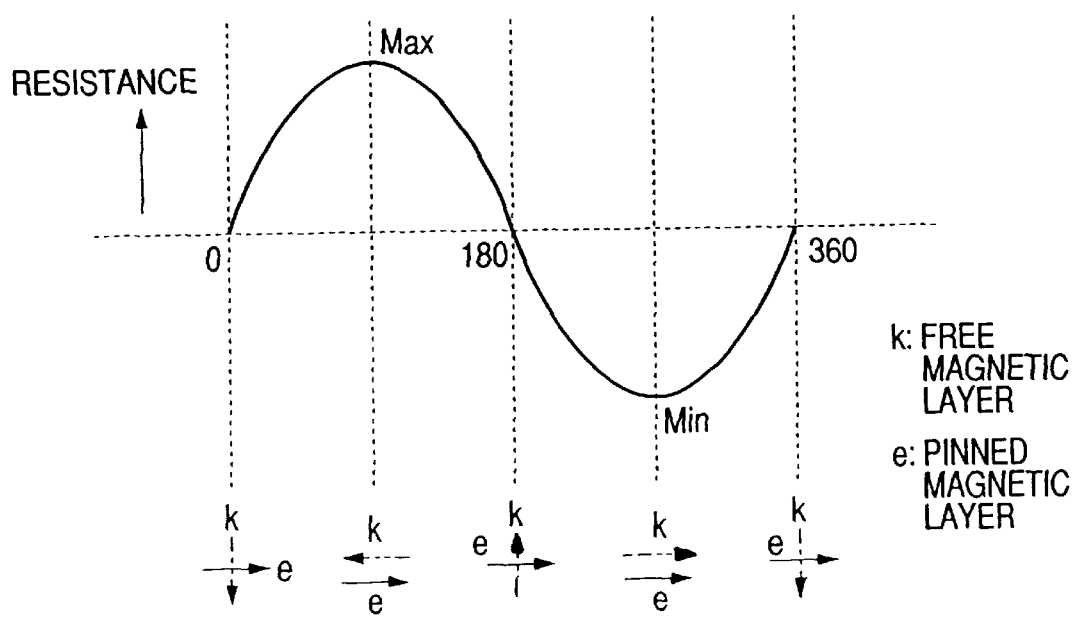
FIG. 5 is an explanatory view showing the state of a change in resistance occurred in giant magnetoresistive effect elements used in the present invention when the direction of magnetization of the free magnetic layer has changed with respect to that of the pinned magnetic layer.

FIG. 5 shows a resistance characteristic responsive to the rotation of the magnetization of the free magnetic layer a when the direction of magnetization of the pinned magnetic layer c is fixed in one direction (rightward) as "e" in, for example, the first giant magnetoresistive effect element 31. The change in resistance shows a minimum value when the direction of magnetization e of the pinned magnetic layer c and the direction of magnetization k of the free magnetic layer a (see FIG. 2) are aligned in the same direction, and a maximum value when they are anti-parallel, the change during the period between them shown by the sine curve in FIG. 5.

Therefore, when an intermediate point of the change in resistance is regarded as the origin, as regards a polarity (a direction in which it increases is set to be positive, and a direction in which it decreases is set to be negative) of the change in resistance, the giant magnetoresistive effect elements 31 and 32 having the same direction of magnetization of the pinned magnetic layer c have the same polarity, and the giant magnetoresistive effect elements 33 and 34 have also the same polarity. However, the giant magnetoresistive effect elements 31 and the giant magnetoresistive effect elements 33 have the opposite-polarity, and the giant magnetoresistive effect elements 32 and the giant magnetoresistive effect elements 34 have the opposite-polarity. Therefore, in the connection structure shown in FIGS. 1 and 2, a Wheatstone bridge of giant magnetoresistive effect elements is to be constituted, and it effectively operates as a magnetic field sensor. Also, in the structure of this form, since the Wheatstone bridge is constituted by the giant magnetoresistive effect elements 31, 32, 33 and 34, an increase in output(increase in rate of change in resistance) and a canceling effect of magnetic noise components due to changes in magnetic field environment (removal of noise components for each giant magnetoresistive effect element due to the direction of earth magnetism, magnetic noise components and the like) can be obtained.

Figure 6:
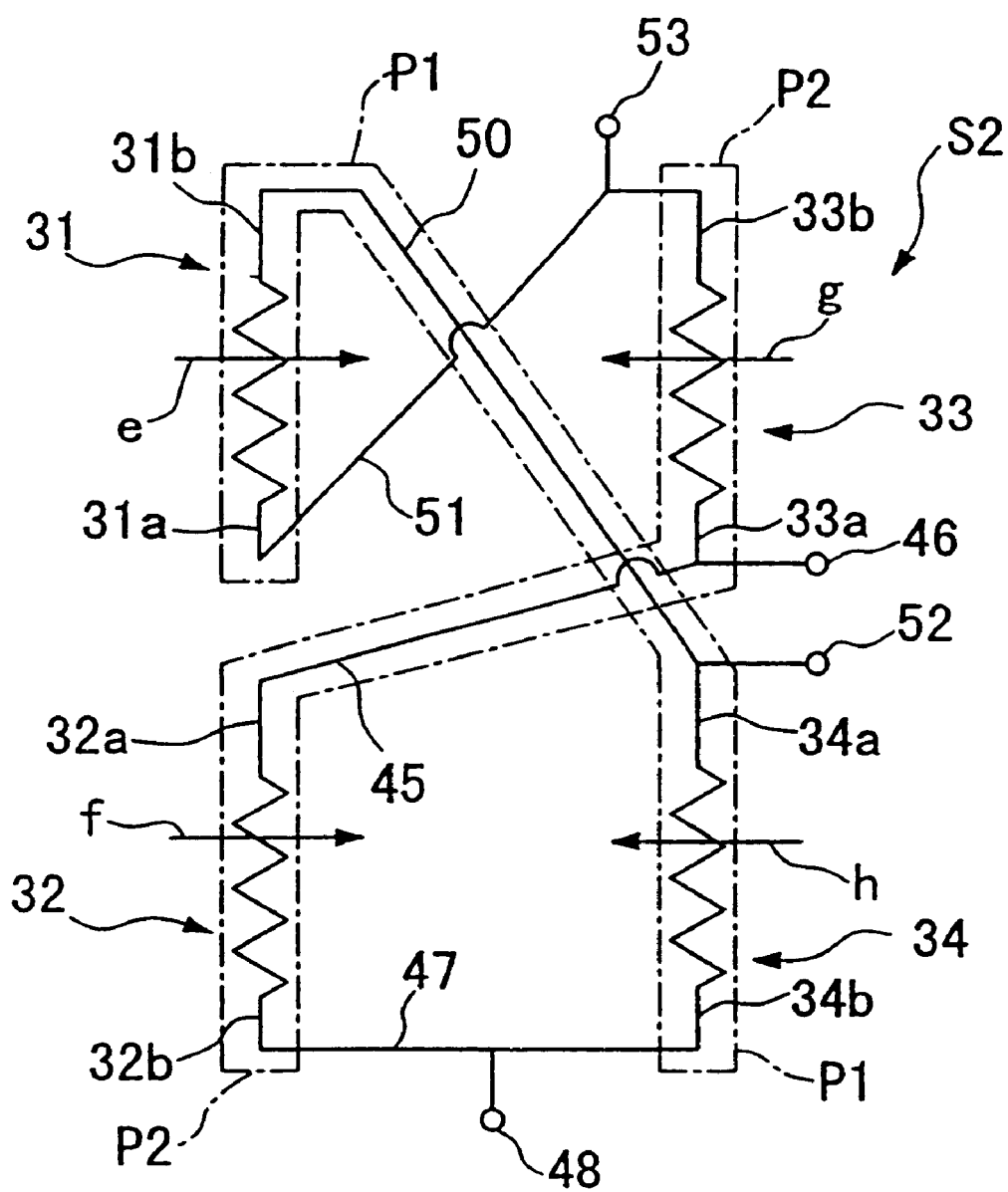
FIG. 6 is a circuit diagram showing a second embodiment of a magnetic field sensor according to the present invention.

FIG. 6 shows a second embodiment of a magnetic field sensor according to the present invention, and in the magnetic field sensor S2 of this form, portions identical to those in the foregoing first embodiment are designated by the identical reference numerals, the explanation of which will be omitted.

Even in the magnetic field sensor S2 of this form, there are provided giant magnetoresistive effect elements 31, 32, 33 and 34 as in the case of the magnetic field sensor S1 of the previous form, and the directions of magnetization of their pinned magnetic layers are aligned in the same direction, but they are only partially different in connection structure due to electric conductors.

One end 31a of the first giant magnetoresistive effect element 31 is connected to the other end 33b of the third giant magnetoresistive effect element 33 through an electric conductor 51, and the other end 31b of the first giant magnetoresistive effect element 31 is connected to one end 34a of the fourth giant magnetoresistive effect element 34 through an electric conductor 50. One end 32a of the second giant magnetoresistive effect element 32 is connected to one end 33a of the third giant magnetoresistive effect element 33 through an electric conductor 45 as in the case of the previous form, and the other end 32b of the second giant magnetoresistive effect element 32 is connected to the other end 34b of the fourth giant magnetoresistive effect element 34 through an electric conductor 47 as in the case of the previous form. The electric conductor 50 is connected to the terminal portion 52 as the connection portion, and the electric conductor 51 is connected to the terminal portion 53 as the connection portion.

In the structure of this form, the first giant magnetoresistive effect element 31 and the fourth giant magnetoresistive effect element 34 are connected in series to constitute a first paired connection P1, and the second giant magnetoresistive effect element 32 and the third giant magnetoresistive effect element 33 are connected to constitute a second paired connection P2.

In the structure shown in FIG. 6, a bridge circuit is constituted by the giant magnetoresistive effect elements 31, 32, 33 and 34, and therefore, this can be used as a magnetic field sensor as in the case of the first embodiment.

Figure 7:
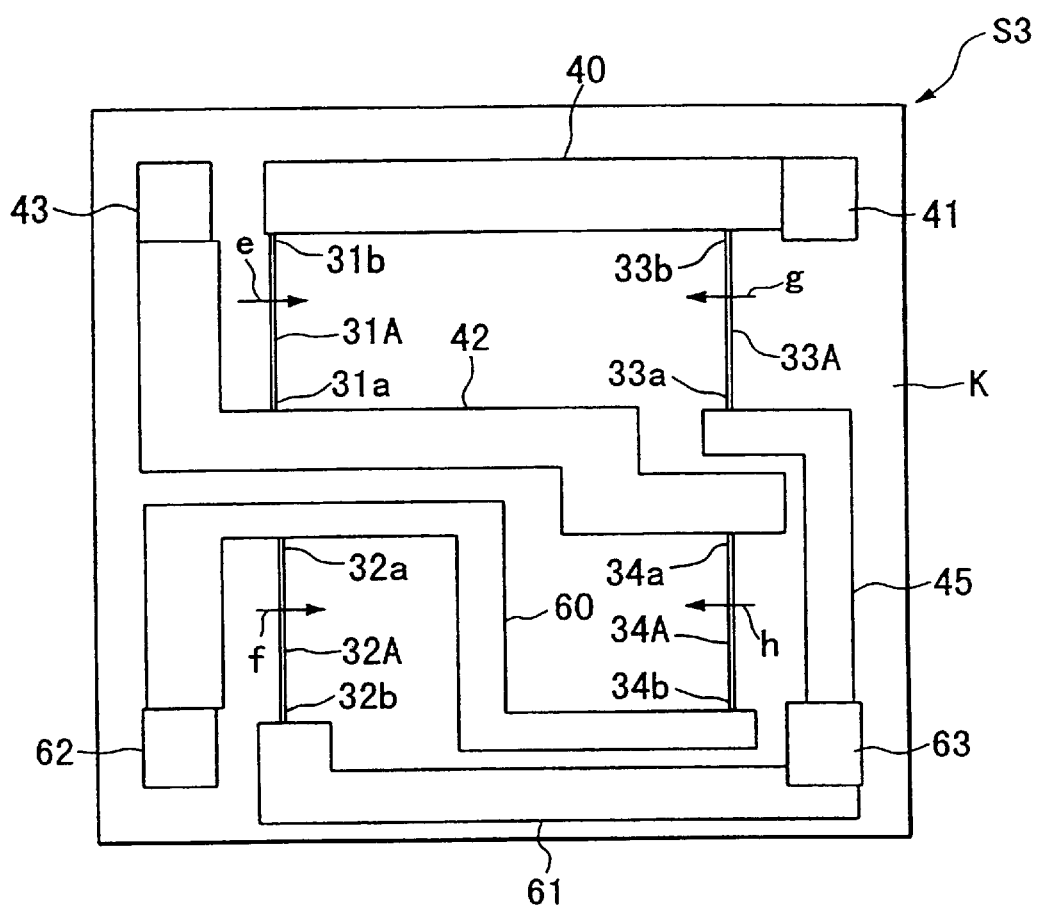
FIG. 7 is a plan view showing a third embodiment of a magnetic field sensor according to the present invention.

FIG. 7 shows a third embodiment of a magnetic field sensor according to the present invention, and in the magnetic field sensor S3 of this form, portions identical to those shown in the foregoing FIG. 3 are designated by the identical reference numerals, the explanation of which will be omitted.

In the magnetic field sensor S3 of this form, there are provided giant magnetoresistive effect elements 31A, 32A, 33A and 34A as in the case of the magnetic field sensor S11 of the previous form, and the directions of magnetization of their pinned magnetic layers are also aligned in the same direction, but they are only partially different in connection structure using electric conductors.

The other end 31b of the first giant magnetoresistive effect element 31A is, as in the case of the structure of FIG. 3, connected to the other end 33b of the third giant magnetoresistive effect element 33A through an electric conductor 40, and one end 31a of the first giant magnetoresistive effect element 31A is, as in the case of the structure of FIG. 3, connected to the one end 34a of the fourth giant magnetoresistive effect element 34A through an electric conductor 42. One end 32a of the second giant magnetoresistive effect element 32A is connected to the other end 34b of the fourth giant magnetoresistive effect element 34A through an electric conductor 60, and the other end 32b of the second giant magnetoresistive effect element 32A is connected to one end 33a of the third giant magnetoresistive effect element 33A through an electric conductor 61 and an electric conductor 45. One portion of the electric conductor 60 is extended into a corner portion of the substrate K to form a terminal portion 62 for input, and in the intermediate portion of the electric conductor 61, a terminal portion 63 for output is formed at a place located in the corner portion of the substrate K.

In the structure shown in FIG. 7, a bridge circuit is constituted by the giant magnetoresistive effect elements 31A, 32A, 33A and 34A, and therefore, this can be used as a magnetic field sensor as in the case of the structure of the first embodiment.

A method of pinning the magnetization of a pinned magnetic layer c in each of giant magnetoresistive effect elements 31A, 32A, 33A and 34A for the magnetic field sensor S3 shown in FIG. 7 will be described below together with a manufacturing method for the magnetic field sensor S3.

In order to manufacture a magnetic field sensor S3 having the structure shown in FIG. 7, necessary films are stacked on a substrate such as a S1 substrate, a photolithographic process is appropriately performed in accordance with the film stacking process as required for patterning.

First, necessary thin films are stacked on a substrate in accordance with the desired stacked structure for giant magnetoresistive effect elements. In the case of giant magnetoresistive effect elements having five-layer structure, five layers of thin films are stacked, in the case of six-layer structure, six layers of thin films are stacked, and in the case of seven-layer structure, seven layers of thin films are stacked.

Next, these stacked films are coated with resist, a photolithographic process is performed, and only a necessary portion is left as a linear giant magnetoresistive effect element.

After resist is formed on these giant magnetoresistive effect elements, electrode films are formed, subsequently the electrode films are worked into a desired shape by the photolithographic process to form electric conductors as shown in FIG. 7, and a magnetic field sensor S3 shown in FIG. 7 can be manufactured by subsequently performing a magnetic field applying process as described later.

Figure 8:
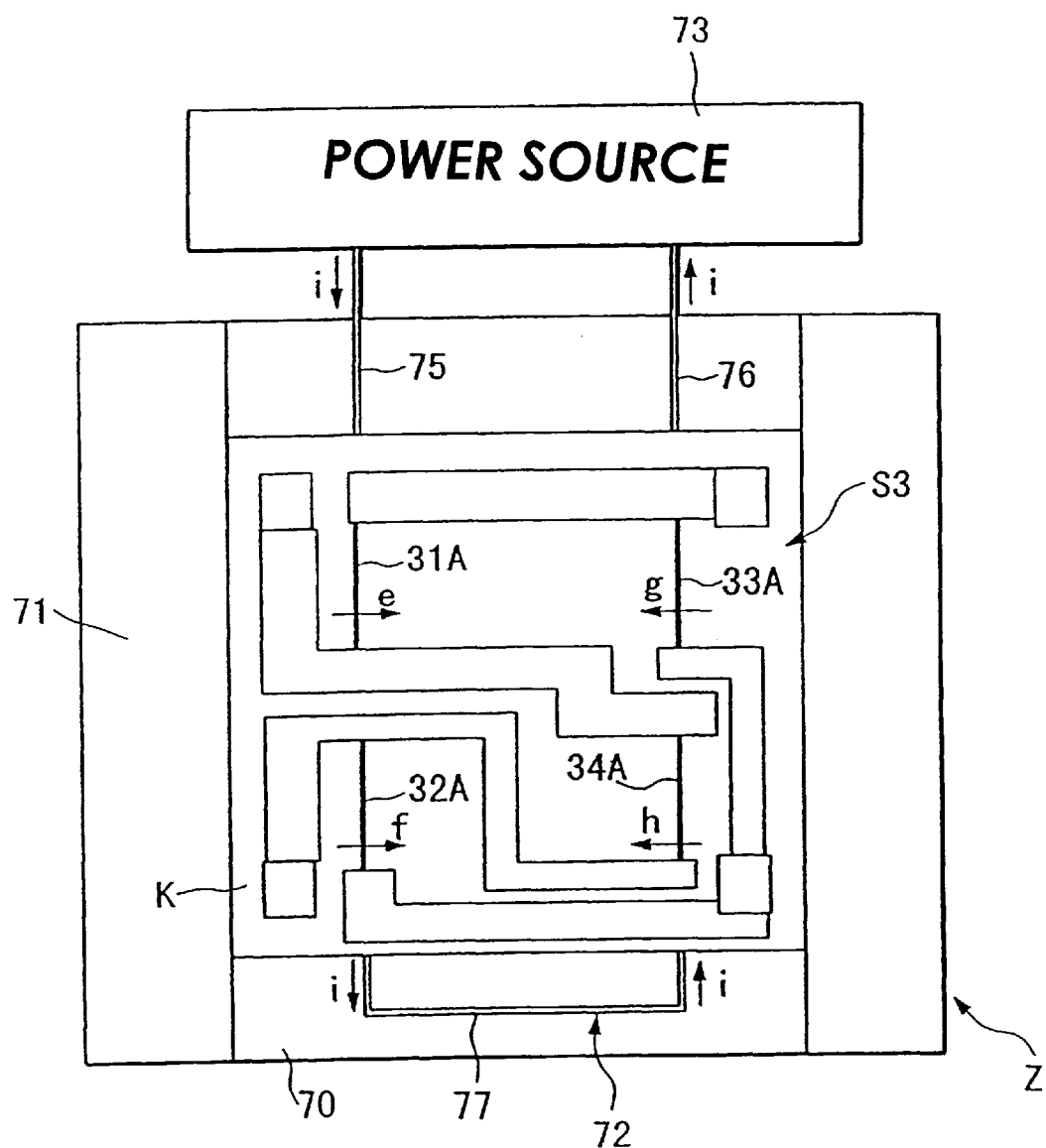
FIG. 8 is a view showing a state in which the magnetic field sensor shown in FIG. 7 is magnetized by a manufacturing apparatus.

In the case of applying a magnetic field, a manufacturing apparatus Z shown in FIG. 8 is used as an example. The manufacturing apparatus Z of this example is mainly composed of a base 71 having a recessed portion 70 having such a width as to allow the substrate K of the magnetic field sensor S3 to be fitted in and installed; a loop type electric conductor 72 installed at the bottom face of this recessed portion 70; and a power source 73 connected to the electric conductor 72. The electric conductor 72 is constructed in a loop shape by a first linear electric conductor 75, a second linear electric conductor 76 parallel to this first electric conductor 75, and a connecting electric conductor 77 for coupling these first electric conductor 75 and second electric conductor 76.

Figure 9:
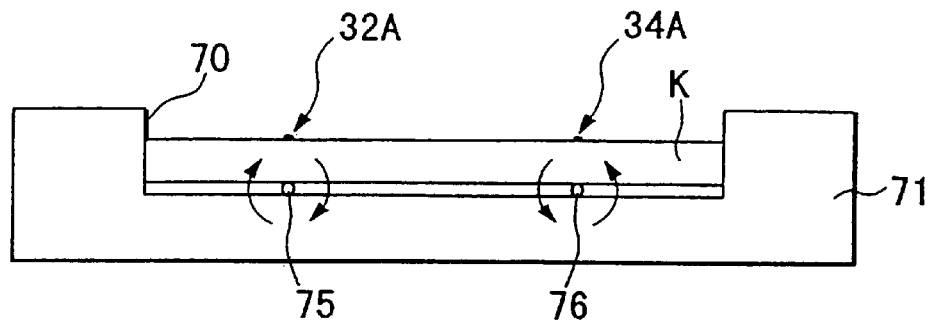
FIG. 9 is a side view showing the same state.

When the substrate K is fitted in and inserted into the recessed portion 70, it is formed such that giant magnetoresistive effect elements 31A and 32A are positioned above the first electric conductor 75, and giant magnetoresistive effect elements 33A and 34A are positioned above the second electric conductor 76 as shown in FIG. 9. A power source 73 is capable of applying DC current for flowing through from the first electric conductor 75 side to the second electric conductor 76 side.

After the substrate K is fitted in and inserted into recessed portion 70 as shown in FIGS. 8 and 9, when DC current flows from the power source, current flowing through the electric conductor 75 causes a clockwise magnetic field around the electric conductor 75 shown in FIG. 9 and current flowing through the electric conductor 76 causes a counterclockwise magnetic field around the electric conductor 76. Therefore, it is possible to magnetize the exchange bias layers d in the first and second giant magnetoresistive effect elements 31A and 32A in a direction indicated by the arrows e and f in FIG. 8 respectively, and to magnetize the exchange bias layers d in the third and fourth giant magnetoresistive effect elements 33A and 34A in a direction indicated by the arrows g and h in FIG. 8. By means of the exchange coupling force of each exchange bias layer d, the directions of magnetization of the pinned magnetic layer c adjacent thereto can be pinned in the respective directions (e direction, f direction, g direction and h direction). When current flowing through the electric conductor 77 is stopped after magnetization, the state of magnetization of the exchange bias layer d is maintained as it is, and therefore, the direction of magnetization of each pinned magnetic layer c is maintained while pinned.

By the above-described processes, there can be obtained a magnetic sensor S3, in which the direction of magnetization of each pinned magnetic layer is controlled as shown in FIG. 8.

In a case where magnetic fields are generated by flowing currents through the first electric conductor 75 and the second electric conductor 76, when the currents flowing through the both electric conductors temporally deviate by 100 μsec for operating, a state of magnetization of exchange bias layers d in the first and second giant magnetoresistive effect elements 31 and 32, and a state of magnetization of exchange bias layers d in the third and fourth giant magnetoresistive effect elements 33 and 34 are unlikely to be the same. Therefore, it is important to connect the first electric conductor 75 and the second electric conductor 76 to the same power source and to generate magnetic fields in a state in which any time lag in application of a magnetic field is eliminated.

If, however, two power sources can be synchronized for magnetization so as to eliminate any time lag in application of a magnetic field, it may be possible to flow current through the first electric conductor 75 and the second electric conductor 76 from separate power sources by connecting them to a plurality of power sources.

In this respect, in a case where the exchange bias layer d is composed of an α-$Fe_2O_3$ layer, a NiO layer, an IrMn layer, and a CrPtMn layer, the magnetization can be performed by such magnetic field applying means instantaneously. If, however, a NiMn layer, a PdPtMn layer, a MnRhRu layer, or a PtMn layer is selected as component material for the exchange bias layer d, it is necessary to magnetize as described previously after heating at a temperature equal to or higher than the blocking temperature, and therefore, it can be utilized because the magnetization can be performed although the magnetization operation becomes complicated.

Figure 10:
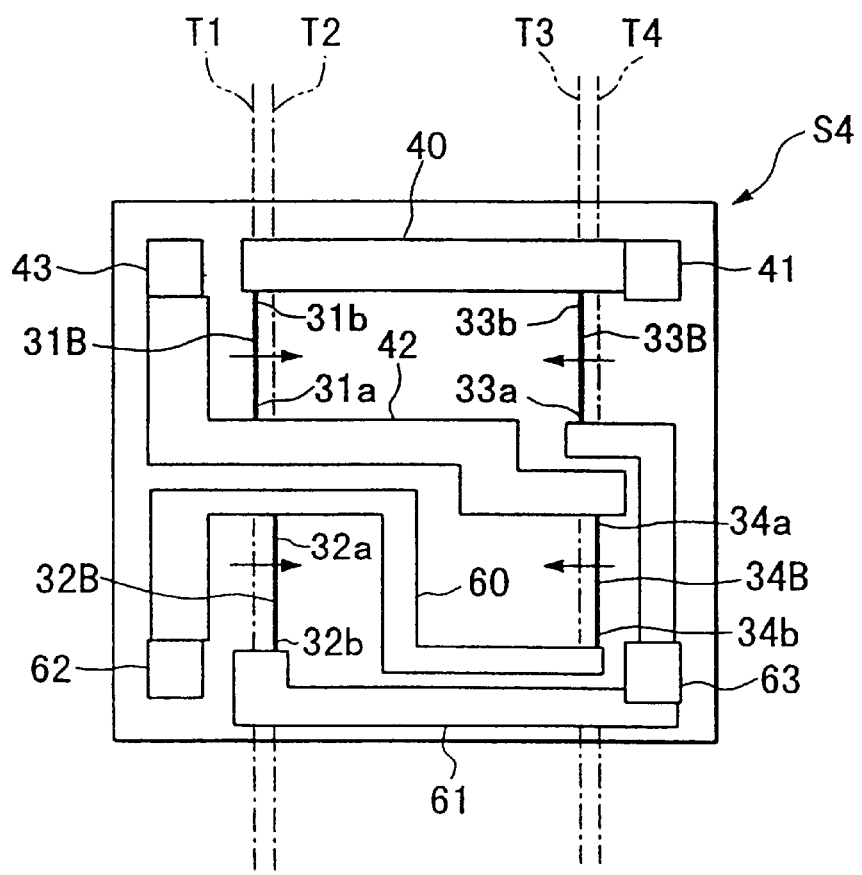
FIG. 10 is a plan view showing a fourth embodiment of a magnetic field sensor according to the present invention.

FIG. 10 shows a fourth embodiment of a magnetic field sensor according to the present invention, and the magnetic field sensor S4 of this form is the same in the basic structure as the magnetic field sensor S3 shown in FIG. 7. They are different in that a first giant magnetoresistive effect element 31B is provided along a first straight line T1, and a second giant magnetoresistive effect element 32B is provided along a second straight line T2, and that a third giant magnetoresistive effect element 33B is provided along a third straight line T3, and a fourth giant magnetoresistive effect element 34B is provided along a fourth straight line T4. The first, second, third and fourth straight lines T1, T2, T3 and T4 are all in parallel, and the straight lines T1 and T2 are arranged adjacent to each other while the straight lines T3 and T4 are arranged adjacent to each other.

The magnetic field sensor S4 of the present embodiment is the same in the other structure as the magnetic sensor S3 shown in FIG. 6, and is capable of obtaining the same effect as the magnetic field sensor S3 of the previous embodiment.

As a manufacturing apparatus used on manufacturing the magnetic field sensor S4, the one shown in FIG. 8 cannot be used without any change. Therefore, the first electric conductor 75 can be bent and deformed so as to meet the position of the first giant magnetoresistive effect element 31B and the position of the second giant magnetoresistive effect element 32B, and the second electric conductor 76 can be bent and deformed so as to meet the position of the third giant magnetoresistive effect element 33B and the position of the fourth giant magnetoresistive effect element 34B for use.

Concretely, in the first electric conductor 75, it is advisable to arrange the structure such that a bent portion is formed between a straight-line portion close to the power source 73 and a straight-line portion spaced apart from the power source 73 (a lower part of the portion between the first giant magnetoresistive effect element 31B and the second giant magnetoresistive effect element 32B) so as to align the bent portion with both the first giant magnetoresistive effect element 31B and the second giant magnetoresistive effect element 32B. Also, in the second electric conductor 76, as in the case of the first electric conductor 75, it is advisable to arrange the structure such that a bent portion is formed in the lower part of a portion between the third giant magnetoresistive effect element 33B and the fourth giant magnetoresistive effect element 34B so as to align the bent portion with the third and fourth giant magnetoresistive effect elements 33B and 34B by means of only the second electric conductor 76.

Supposing that a bridge circuit is constituted of four giant magnetoresistive effect elements as in the case of each embodiment described above, it is preferable to arrange the first and second giant magnetoresistive effect elements on the same straight line, and to arrange the third and fourth giant magnetoresistive effect elements on the same straight line. However, the giant magnetoresistive effect elements may be arranged in a slightly misregistered state as in the embodiment shown in FIG. 10. Also, it is not necessary to arrange all the giant magnetoresistive effect elements completely in parallel with one another. In the case of constituting a bridge circuit, it goes without saying that it may be arranged by inclining it to such a degree that detection of resistance having different phases is not affected.

Embodiments

On a Si substrate of 3.6 mm long×3.6 mm wide, four linear giant magnetoresistive effect elements of 0.05 mm wide×1.75 mm long are formed in parallel with one another in the positions shown in FIG. 7 to form a magnetic field sensor having the basic structure.

For stacked structure for each giant magnetoresistive effect element, there has been adopted the stacked structure consisting of eight layers: $Al_2O_3$ layer (1000 Å thick)/$\alpha$-$Fe_2O_3$ layer(1000 Å thick)/NiFe layer (30 Å thick)/Co layer(10 Å thick) /Cu layer (22 Å thick)/Co layer (10 Å thick) /NiFe layer (77 Å thick)/Ta (30 Å thick). An electric conductor through which end portions of each giant magnetoresistive effect element are connected is formed of Cr film, and the electric conductor connecting shape shown in FIG. 7 has been adopted.

Next, the substrate is set to an apparatus shown in FIGS. 8 and 9, current of 3500 A is flowed through the first electric conductor and the second electric conductor having a diameter of 0.8 to 0.9 mm consisting of copper wire for time of 100 $\mu$sec to magnetize the exchange bias layer, and a magnetic field sensor is thus obtained.

Figure 11:
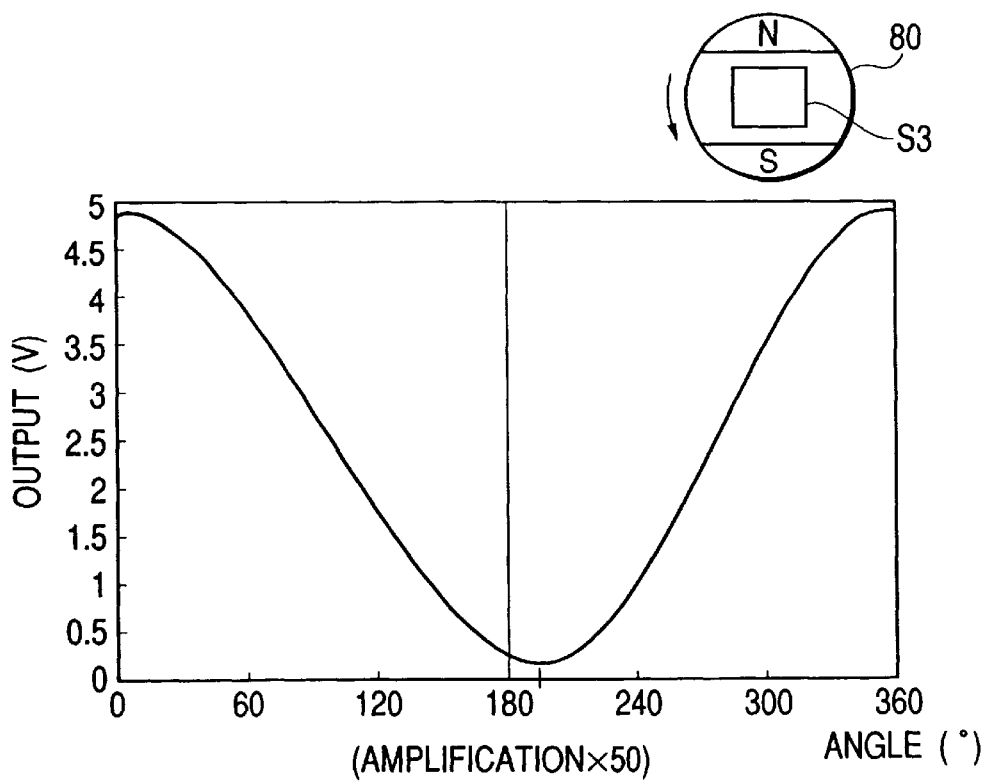
FIG. 11 is a view showing output measurement result obtained by a magnetic field sensor of the embodiment.
Figure 12:
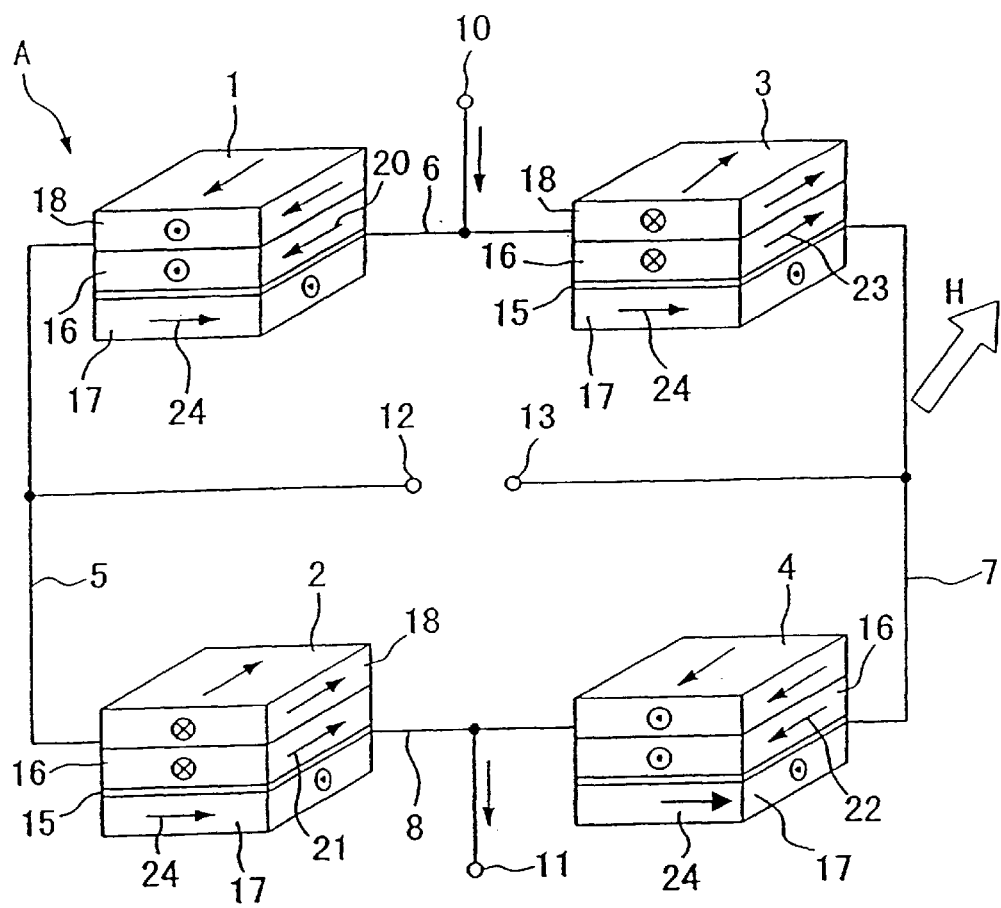
FIG. 12 is a schematic structural view showing an example of a conventional magnetic field sensor.
Figure 13:
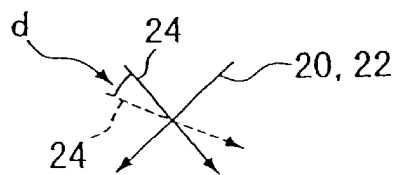
FIG. 13 is a view showing relationship between the direction of magnetization of the pinned magnetic layer in giant magnetoresistive effect elements provided for the magnetic field sensor shown in FIG. 12 and that of the free magnetic layer.

As an external magnetic field, a cylindrical magnet 80 shown in FIG. 11 is arranged on the surface side of the magnetic field sensor S3 with a gap of 11 mm interposed therebetween, the magnetic field sensor S3 is fixed, and a sine curve-shaped symmetrical magnetic field is applied to this magnetic field sensor by rotating the cylindrical magnet 80 around its circumference. Thus, an output curve shown in FIG. 11 can be obtained, and it can be confirmed that it operates as a magnetic field sensor.

As described above, in a magnetic field sensor according to the present invention, the directions of magnetization of the pinned magnetic layers in the first and second giant magnetoresistive effect elements, which are arranged on the same straight line, are aligned in the same direction, the directions of magnetization of the pinned magnetic layers in the third and fourth giant magnetoresistive effect elements, which are arranged on the same straight line, are aligned in the same direction, which is 180° different, and the first, second, third and fourth giant magnetoresistive effect elements are connected together, whereby a bridge circuit using giant magnetoresistive effect elements can be constituted.

The magnetization of the exchange bias layers in the first and second giant magnetoresistive effect elements can be performed in the same magnetic field in the same direction collectively, and the magnetization of the exchange bias layers in the third and fourth giant magnetoresistive effect elements can be performed in the same magnetic field in the same direction collectively for manufacture. Therefore, the present invention has an effect that the magnetization operation can be performed noticeably easily as compared with the conventional structure in which it was necessary to magnetize those four elements in different directions from one another. Therefore, a magnetic field sensor having excellent productivity can be provided.

Also, the present invention can be achieved even in the structure that the first, second, third and fourth giant magnetoresistive effect elements are arranged on different straight lines which are parallel to one another.

Since a Wheatstone bridge using giant magnetoresistive effect elements can be easily constituted by bridge-connecting the first, second, third and fourth giant magnetoresistive effect elements, it is possible to provide a magnetic field sensor capable of increasing the output, easily canceling noise magnetic fields when environmental noise magnetic fields operate, and detecting magnetic fields accurately.

The present invention is characterized by the fact that it is very easy to manufacture the apparatus because when there is adopted the structure in which the directions of magnetization of the pinned magnetic layers in the first and second giant magnetoresistive effect elements, which are arranged on the same straight line, are aligned in the same direction, and in which the directions of magnetization of the pinned magnetic layers in the third and fourth giant magnetoresistive effect elements, which are arranged on the same straight line, are aligned in the same direction, which is 180° different, the directions of magnetization of the pinned magnetic layers in four giant magnetoresistive effect elements can be easily aligned in a desired direction by means of magnetic fields generated by flowing currents through the first electric conductor arranged along the first and second giant magnetoresistive effect elements, and the second electric conductor arranged along the third and fourth giant magnetoresistive effect elements.

In a manufacturing apparatus according to the present invention, in order to manufacture a magnetic field sensor having the above-described structure, there are provided first and second electric conductors, the apparatus in which they are connected to a power source is used, the first electric conductor is arranged along the first and second giant magnetoresistive effect elements, the second electric conductor is arranged along the third and fourth giant magnetoresistive effect elements, and currents are flowed through these electric conductors to apply magnetic fields, whereby it is possible to easily pin the directions of magnetization of the pinned magnetic layers in a desired direction.

What is claimed is:

1. A magnetic field sensor having four giant magnetoresistive effect elements, each of the giant magnetoresistive effect elements comprising: an exchange bias layer; a pinned magnetic layer whose direction of magnetization has been fixed in one direction by means of this exchange bias layer; a non-magnetic layer; and a free magnetic layer whose direction of magnetization has been made freely rotatable by means of an external magnetic field, wherein the pinned magnetic layer is stacked on the exchange bias layer, the non-magnetic layer is stacked on the pinned magnetic layer, and the free layer is stacked on the non-magnetic layer;

a first giant magnetoresistive effect element and a second giant magnetoresistive effect element being provided along a first straight line, and so that the magnetization of each of said pinned magnetic layers is oriented in a same predetermined orientation orthogonal to the first straight line; and a third giant magnetoresistive effect element and a fourth giant magnetoresistive effect element being provided along a second straight line parallel to said first straight line so that the magnetization of each of said pinned magnetic layers in said third and fourth giant magnetoresistive effect elements is oriented 180° opposite to the directions of magnetization of the pinned magnetic layers in said first and second giant magnetoresistive effect elements.

2. A magnetic field sensor having four giant magnetoresistive effect elements, each of the giant magnetoresistive effect elements comprising: an exchange bias layer; a pinned magnetic layer whose direction of magnetization has been fixed in one direction by means of this exchange bias layer; a non-magnetic layer; and a free magnetic layer whose direction of magnetization has been made freely rotatable by means of an external magnetic field, wherein the pinned magnetic layer is stacked on the exchange bias layer, the non-magnetic layer is stacked on the pinned magnetic layer, and the free layer is stacked on the non-magnetic layer, first, second, third and fourth giant magnetoresistive effect elements being provided along first, second, third and fourth straight lines, respectively, said straight lines each being substantially parallel to each other, said first and third straight lines being proximately adjacent to each other, and said second and fourth straight lines being proximately adjacent to each other;

the magnetization of respective pinned magnetic layers in said first and second giant magnetoresistive effect elements being oriented in a same predetermined orientation orthogonal to the first straight line; and the magnetization of respective pinned magnetic layers in said third and fourth giant magnetoresistive effect elements being oriented 180° opposite to the directions of magnetization of respective pinned magnetic layers in said first and second giant magnetoresistive effect elements.

3. A magnetic field sensor having giant magnetoresistive effect elements according to claim 1, wherein giant magnetoresistive effect elements having pinned magnetic layers magnetized in different directions are connected in series to constitute two sets of paired connections, one end of a first paired connection of giant magnetoresistive effect elements is connected to one end of a second paired connection of giant magnetoresistive effect elements to constitute a first connection portion, the other end of the second paired connection of giant magnetoresistive effect elements is connected to the other end of the first paired connection of giant magnetoresistive effect elements to constitute a second connection portion, each of the connection portions is constituted at a middle point of said giant magnetoresistive effect elements connected in series, and an input-side terminal portion is formed at a pair of said connection portions while an output-side terminal portion is formed at a pair of the other connection portions.

4. A magnetic field sensor having giant magnetoresistive effect elements according to claim 1, wherein a first side of said first giant magnetoresistive effect element is connected to a first side of said fourth giant magnetoresistive effect element, a first side of said second giant magnetoresistive effect element is connected to a first side of said third giant magnetoresistive effect element, a second side of said first giant magnetoresistive effect element is connected to a second side of said third giant magnetoresistive effect element, and a second side of said second giant magnetoresistive effect element is connected to a second side of said fourth giant magnetoresistive effect element, further wherein an input terminal portion is connected to a portion connected between the second sides of said first and third giant magnetoresistive effect elements and to a portion connected between the second sides of said second and fourth giant magnetoresistive effect elements, and an output terminal portion is connected to a portion connected between the first sides of said first and fourth giant magnetoresistive effect elements and to a portion connected between the first sides of said second and third giant magnetoresistive effect elements.

5. A manufacturing method for a magnetic field sensor having four giant magnetoresistive effect elements, each of the giant magnetoresistive effect elements comprising: an exchange bias layer; a pinned magnetic layer whose direction of magnetization has been fixed in one direction by means of this exchange bias layer; a non-magnetic layer; and a free magnetic layer whose direction of magnetization has been made freely rotatable by means of an external magnetic field, the pinned magnetic layer being stacked on the exchange bias layer, the non-magnetic layer being stacked on the pinned magnetic layer, and the free layer being stacked on the non-magnetic layer, wherein the method comprises the steps of:

arranging a first giant magnetoresistive effect element and a second giant magnetoresistive effect element along a first straight line;

arranging a first electric conductor along said first straight line;

arranging a third giant magnetoresistive effect element and a fourth giant magnetoresistive effect element along a second straight line; and arranging a second electric conductor along said second straight line, wherein currents having different directions by 180° are flowed through said first electric conductor and said second electric conductor to generate magnetic fields from each electric conductor, the exchange bias layer in each giant magnetoresistive effect element is magnetized by means of the magnetic fields generated from each electric conductor to thereby fix the magnetization of each of said pinned magnetic layers, said pinned magnetic layers in said first and second giant magnetoresistive effect elements are oriented in a fixed direction, and said pinned magnetic layers in said third and fourth giant magnetoresistive effect elements are oriented 180° opposite to the directions of said pinned magnetic layers in said first and second giant magnetoresistive effect elements.

6. A manufacturing method for a magnetic field sensor having four giant magnetoresistive effect elements, each of the giant magnetoresistive effect elements comprising: an exchange bias layer; a pinned magnetic layer whose direction of magnetization has been fixed in one direction by means of this exchange bias layer; a non-magnetic layer; and a free magnetic layer whose direction of magnetization has been made freely rotatable by means of an external magnetic field, the pinned magnetic layer being stacked on the exchange bias layer, the non-magnetic layer being stacked on the pinned magnetic layer, and the free layer being stacked on the non-magnetic layer, wherein the method comprises the steps of:

arranging a first giant magnetoresistive effect element, a second giant magnetoresistive effect element, a third giant magnetoresistive effect element, and a fourth giant magnetoresistive effect element along first, second, third and fourth straight lines, respectively, said straight lines each being substantially parallel to each other, said first and third straight lines being proximately adjacent to each other, and said second and fourth straight lines being proximately adjacent to each other;

arranging a first electric conductor along said first and second giant magnetoresistive effect elements; and arranging a second electric conductor along said third and fourth giant magnetoresistive effect elements, wherein currents having different directions by 180° are flowed through said first electric conductor and said second electric conductor to generate magnetic fields from each electric conductor, the exchange bias layer in each giant magnetoresistive effect element is magnetized by means of the magnetic fields generated from each electric conductor to thereby fix the magnetization of each of said pinned magnetic layers, said pinned magnetic layers in said first and second giant magnetoresistive effect elements are oriented in a fixed direction, and said pinned magnetic layers in said third and fourth giant magnetoresistive effect elements are oriented 180° opposite to the directions of said pinned magnetic layers in said first and second giant magnetoresistive effect elements.

7. A manufacturing method for a magnetic field sensor having giant magnetoresistive effect elements according to claim 5, wherein said first electric conductor and said second electric conductors are connected in series and are connected to the same power source for applying current.

8. A manufacturing apparatus for a magnetic field sensor having four giant magnetoresistive effect elements, each of the giant magnetoresistive effect elements comprising: an exchange bias layer; a pinned magnetic layer whose direction of magnetization has been fixed in one direction by means of this exchange bias layer; a non-magnetic layer; and a free magnetic layer whose direction of magnetization has been made freely rotatable by means of an external magnetic field, wherein the pinned magnetic layer is stacked on the exchange bias layer, the non-magnetic layer is stacked on the pinned magnetic layer, and the free layer is stacked on the non-magnetic layer, a first giant magnetoresistive effect element and a second giant magnetoresistive effect element being arranged along a first straight line, a first electric conductor being arranged along said first straight line, a third giant magnetoresistive effect element and a fourth giant magnetoresistive effect element being arranged along a second straight line, a second electric conductor being arranged along said second straight line, there being provided a power source for flowing currents having different directions by 180° through said first electric conductor and said second electric conductor, the pinned magnetic layers in said first and second giant magnetoresistive effect elements being oriented in a fixed direction, and said pinned magnetic layers in said third and fourth giant magnetoresistive effect elements being oriented 180° opposite to the directions of said pinned magnetic layers in said first and second giant magnetoresistive effect elements.

9. A manufacturing apparatus for a magnetic field sensor having four giant magnetoresistive effect elements, each of the giant magnetoresistive effect elements comprising: an exchange bias layer; a pinned magnetic layer whose direction of magnetization has been fixed in one direction by means of this exchange bias layer; a non-magnetic layer; and a free magnetic layer whose direction of magnetization has been made freely rotatable by means of an external magnetic field, wherein the pinned magnetic layer is stacked on the exchange bias layer, the non-magnetic layer is stacked on the pinned magnetic layer, and the free layer is stacked on the non-magnetic layer, a first giant magnetoresistive effect element, a second giant magnetoresistive effect element, a third giant magnetoresistive effect element, and a fourth giant magnetoresistive effect element being arranged along first, second, third and fourth straight lines, respectively, said straight lines each being substantially parallel to each other, said first and third straight lines being proximately adjacent to each other, and said second and fourth straight lines being proximately adjacent to each other, a first electric conductor being arranged along said first and second giant magnetoresistive effect elements, a second electric conductor being arranged along said third and fourth giant magnetoresistive effect elements, there being provided a power source for flowing currents having different directions by 180° through said first electric conductor and said second electric conductor, said pinned magnetic layers in said first and second giant magnetoresistive effect elements being oriented in a fixed direction, and said pinned magnetic layers in said third and fourth giant magnetoresistive effect elements being oriented 180° opposite to the directions of said pinned magnetic layers in said first and second giant magnetoresistive effect elements.

10. A manufacturing apparatus for a magnetic field sensor according to claim 8, wherein said first electric conductor and said second electric conductor are connected in series, and are connected to the same power source.

11. A manufacturing apparatus for a magnetic field sensor according to claim 8, wherein said first electric conductor and said second electric conductors are connected in series in a loop shape, and are connected to the same power source.

12. A magnetic field sensor having giant magnetoresistive effect elements according to claim 2, wherein giant magnetoresistive effect elements having pinned magnetic layers magnetized in different directions are connected in series to constitute two sets of paired connections, one end of a first paired connection of giant magnetoresistive effect elements is connected to one end of a second paired connection of giant magnetoresistive effect elements to constitute a first connection portion, the other end of the second paired connection of giant magnetoresistive effect elements is connected to the other end of the first paired connection of giant magnetoresistive effect elements to constitute a second connection portion, each of the connection portions is constituted at a middle point of said giant magnetoresistive effect elements connected in series, and an input-side terminal portion is formed at a pair of said connection portions while an output-side terminal portion is formed at a pair of the other connection portions.

13. A magnetic field sensor having giant magnetoresistive effect elements according to claim 2, wherein a first side of said first giant magnetoresistive effect element is connected to a first side of said fourth giant magnetoresistive effect element, a first side of said second giant magnetoresistive effect element is connected to a first side of said third giant magnetoresistive effect element, a second side of said first giant magnetoresistive effect element is connected to a second side of said third giant magnetoresistive effect element, and a second side of said second giant magnetoresistive effect element is connected to a second side of said fourth giant magnetoresistive effect element, further wherein an input terminal portion is connected to a portion connected between the second sides of said first and third giant magnetoresistive effect elements and to a portion connected between the second sides of said second and fourth giant magnetoresistive effect elements, and an output terminal portion is connected to a portion connected between the first sides of said first and fourth giant magnetoresistive effect elements and to a portion connected between the first sides of said second and third giant magnetoresistive effect elements.

14. A manufacturing method for a magnetic field sensor having giant magnetoresistive effect elements according to claim 6, wherein said first electric conductor and said second electric conductors are connected in series and are connected to the same power source for applying current.

15. A manufacturing apparatus for a magnetic field sensor according to claim 9, wherein said first electric conductor and said second electric conductor are connected in series, and are connected to the same power source.

16. A manufacturing apparatus for a magnetic field sensor according to claim 9, wherein said first electric conductor and said second electric conductors are connected in series in a loop shape, and are connected to the same power source.

* * * * *